US010297565B2

(12) United States Patent
Mathews et al.

(10) Patent No.: US 10,297,565 B2
(45) Date of Patent: *May 21, 2019

(54) ELECTRONIC DEVICE BY LASER-INDUCED FORMING AND TRANSFER OF SHAPED METALLIC INTERCONNECTS

(71) Applicant: The United States of America, as represented by the Secretary of the Navy, Washington, DC (US)

(72) Inventors: Scott A. Mathews, Takoma Park, MD (US); Iyoel Beniam, Washington, DC (US); Alberto Piqué, Crofton, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/962,736

(22) Filed: Apr. 25, 2018

(65) Prior Publication Data

US 2018/0240772 A1    Aug. 23, 2018

Related U.S. Application Data

(63) Continuation of application No. 15/489,958, filed on Apr. 18, 2017, now Pat. No. 9,966,356, which is a
(Continued)

(51) Int. Cl.
*H01L 21/44* (2006.01)
*H01L 23/00* (2006.01)
(Continued)

(52) U.S. Cl.
CPC .......... *H01L 24/48* (2013.01); *H01L 21/4828* (2013.01); *H01L 21/76885* (2013.01); *H01L 24/05* (2013.01); *H01L 24/43* (2013.01);
*H01L 24/45* (2013.01); *H01L 24/85* (2013.01); *H01L 2224/04042* (2013.01); *H01L 2224/29147* (2013.01); *H01L 2224/43001* (2013.01); *H01L 2224/435* (2013.01); *H01L 2224/45012* (2013.01); *H01L 2224/45014* (2013.01); *H01L 2224/45147* (2013.01); *H01L 2224/4805* (2013.01); *H01L 2224/4814* (2013.01);
(Continued)

(58) Field of Classification Search
CPC ........... H01L 21/4828; H01L 21/76885; H01L 24/05; H01L 24/43; H01L 24/45; H01L 24/48; H01L 24/85; H01L 2224/04042; H01L 2224/43001; H01L 2224/435; H01L 2224/45012; H01L 2224/45014; H01L 2224/4805; H01L 2224/48101; H01L 2224/4814; H01L 2224/8585
USPC ................................................... 438/611–617
See application file for complete search history.

(56) References Cited

U.S. PATENT DOCUMENTS 8,153,201 B2 * 4/2012 Aoyama ............. H01L 51/0013
427/407.1

* cited by examiner

*Primary Examiner* — Brook Kebede
(74) *Attorney, Agent, or Firm* — US Naval Research Laboratory; Stephen T. Hunnius

(57) ABSTRACT

An electronic device made from the method of providing a donor substrate comprising an array of metallic interconnects, using a laser system to prepare the metallic interconnects, forming shaped metallic interconnects, laser bending the shaped metallic interconnects; and transferring the shaped metallic interconnects onto a receiving substrate or device.

9 Claims, 7 Drawing Sheets

Related U.S. Application Data continuation of application No. 15/178,930, filed on Jun. 10, 2016, now Pat. No. 9,685,349.

(60) Provisional application No. 62/238,892, filed on Oct. 8, 2015.

(51) Int. Cl.
*H01L 21/48* (2006.01)
*H01L 21/768* (2006.01)

(52) U.S. Cl.
CPC ............... *H01L 2224/48101* (2013.01); *H01L 2224/48472* (2013.01); *H01L 2224/85039* (2013.01); *H01L 2224/8584* (2013.01); *H01L 2224/8585* (2013.01); *H01L 2924/00014* (2013.01)

a) Copper beams on donor substrate b) Copper beams after laser shaping c) Close up view of laser shaped beams d) Close up view at a glancing angle of laser shaped beams a) Four silicon capacitors connected in parallel with flat copper beams b) Close up view of single interconnect attached with silver paste c) Glancing angle close up view a) Four silicon capacitors connected in parallel with shaped copper beams b) Close up view of single interconnect attached with silver paste c) Glancing angle close up view d) SEM image of folded beam

ELECTRONIC DEVICE BY LASER-INDUCED FORMING AND TRANSFER OF SHAPED METALLIC INTERCONNECTS

This application claims priority to and the benefits of U.S. patent application Ser. No. 15/489,958 filed on Apr. 18, 2017 and U.S. patent application Ser. No. 15/178,930 filed on Jun. 10, 2016 and U.S. Patent Application No. 62/238,892 filed on Oct. 8, 2015, the entirety of each is herein incorporated by reference.

BACKGROUND

The need for implementing electronic systems that are compatible with new additive manufacturing, 3D printing and direct-write processes has pushed current electronic manufacturing techniques to their limit. In particular, traditional approaches to the manufacture of printed circuit boards are not compatible with the needs of a new generation of electronic systems that call for electronic circuits to be conformal, flexible and hybrid in nature.

Conformal circuits are needed to place electronics in three-dimensional (3D) configurations rather than standard planar or 2D, a requirement that is becoming more urgent as 3D printed electronics mature and become more reliable. Flexible circuits require the integration of components into substrates or packages that are mechanically compliant so that they can conform, bend, stretch or fold to a level pre-designed without causing the circuit to fail. Finally, hybrid circuits are comprised of distinct discrete components integrated into single or multilayer architectures assembled on non-traditional substrates as opposed to printed circuit boards. Examples of such components include logic, communication, memory, sensing and power elements all integrated into a functional system or module.

The overarching challenge is to move away from traditional printed circuit fabrication techniques, which limit the ability to produce conformal, flexible and hybrid designs.

One of the most difficult obstacles toward this goal is to replace the way the interconnects on a circuit are currently generated using soldering of packaged components, which are bulky and of limited use in a conformal and/or flexible design, and wire-bonding of unpackaged devices (incompatible with the low profile requirements of most conformal and hybrid designs).

The solution to this problem calls for the development of processes and techniques that allow the printing of low profile, yet robust interconnects between discrete components.

To date, the use of printable inks or pastes to form interconnects has only had limited success due to the poor electrical performance of these printed filaments and their fragile nature.

Processing techniques such as laser direct-write (LDW) offer a viable alternative for the fabrication of low profile yet compliant, and robust, yet electrically conductive interconnects. These techniques allow the patterning of customizable electrically conductive metallic beams, which can be shaped or formed via laser folding to accommodate misalignment and strains between components. The same techniques then enable the non-contact laser-transfer of these shaped beams placing them precisely across the devices to electrically connect them across a gap. As a result, the ability to shape and print low profile, electrically conductive and freestanding interconnects across a gap for wiring the components required for the fabrication of conformal, flexible and hybrid electronics becomes possible for the first time through the application of this invention.

In order to create a suite of additive manufacturing processes capable of fabricating and assembling robust electronic circuits, this invention extends our previous work on the laser-induced forward transfer (LIFT) of discrete devices to include the transfer of metallic interconnects and commercial solder pastes.

In addition to applying LIFT to the laser transfer of solid metal interconnects, this invention incorporates the laser-induced bending and/or shaping of these interconnects in order to create structures that are capable of accommodating very large strains.

In conjunction with these two steps, a LIFT process is also used to print conductive adhesives or solder pastes, resulting in low-profile interconnects that are both mechanically and electrically attached to the device and surrounding circuit and are capable of withstanding deformation and strains that would result in the failure of a traditionally inkjet printed metallic trace.

BRIEF SUMMARY OF THE INVENTION

This invention allows for the implementation of reliable low-profile interconnects able to conduct high current loads (>1 Amp) for printed electronic applications.

This invention utilizes laser forming or shaping of electrically conductive metal beams, followed by laser transfer of these beams over the device pads to form robust, free-standing interconnects between discrete devices or components.

When in place, these laser-shaped and transferred metallic beams give rise to the electrical connections or "wiring" required for the operation of the resulting circuit.

The methods disclosed in this invention, concerning laser shaping and transferring, can be used to generate all kinds of electrical interconnects between discrete devices and other components such as chip carriers, flexible substrates and external connectors found in all types of electronic circuit and systems.

This invention is related to traditional wire bonding, however, significant advantages are taught herein that result in laser-shaped and transferred interconnects occupying a fraction of the volume due to their low profile, as shown schematically in FIG. 1.

This invention solves long-standing problems and allows for embedded and flexible electronic circuits and systems.

Application of these folded micro-assemblies offers a unique and novel way to develop highly complex yet reconfigurable arrays of 3D microstructures with novel electrical, optical and/or mechanical properties.

DETAILED DESCRIPTION

This invention allows for the implementation of reliable low-profile interconnects able to conduct high current loads (>1 Amp) for printed electronic applications. This invention utilizes laser forming or shaping of electrically conductive metal beams, followed by laser transfer of these beams over the device pads to form robust, free-standing interconnects between discrete devices or components.

These laser-shaped and transferred metallic beams give rise to the electrical connections or "wiring" required for the operation of the resulting circuit.

The methods disclosed in this invention, concerning laser shaping and transferring, generate all kinds of electrical interconnects between discrete devices and other components. Examples include chip carriers, flexible substrates and external connectors found in all types of electronic circuit and systems.

Figure 1:
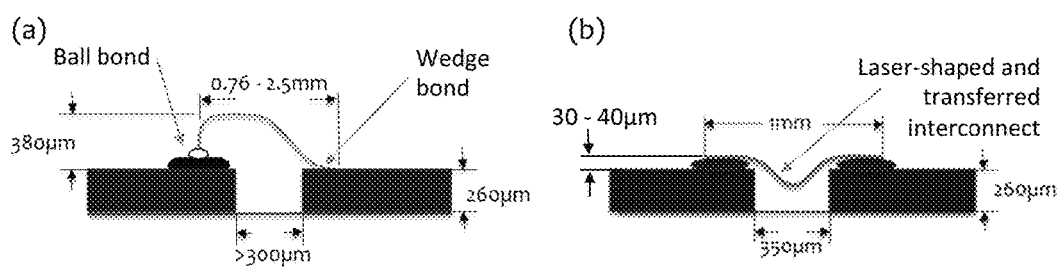
FIG. 1 is a schematic diagram showing the typical profiles of (a) wire-bonded interconnects vs. (b) laser transferred shaped interconnects.

Significant advantages are taught herein that result in laser-shaped and transferred interconnects occupying a fraction of the volume of the prior art due to their low profile, as shown schematically in FIG. 1.

This invention solves long-standing problems and allows for embedded and flexible electronic circuits and systems that are superior to the prior art.

The invention herein describes a novel laser-based method for the fabrication of low-profile, free-standing, compliant and electrically conductive interconnects.

Figure 2:
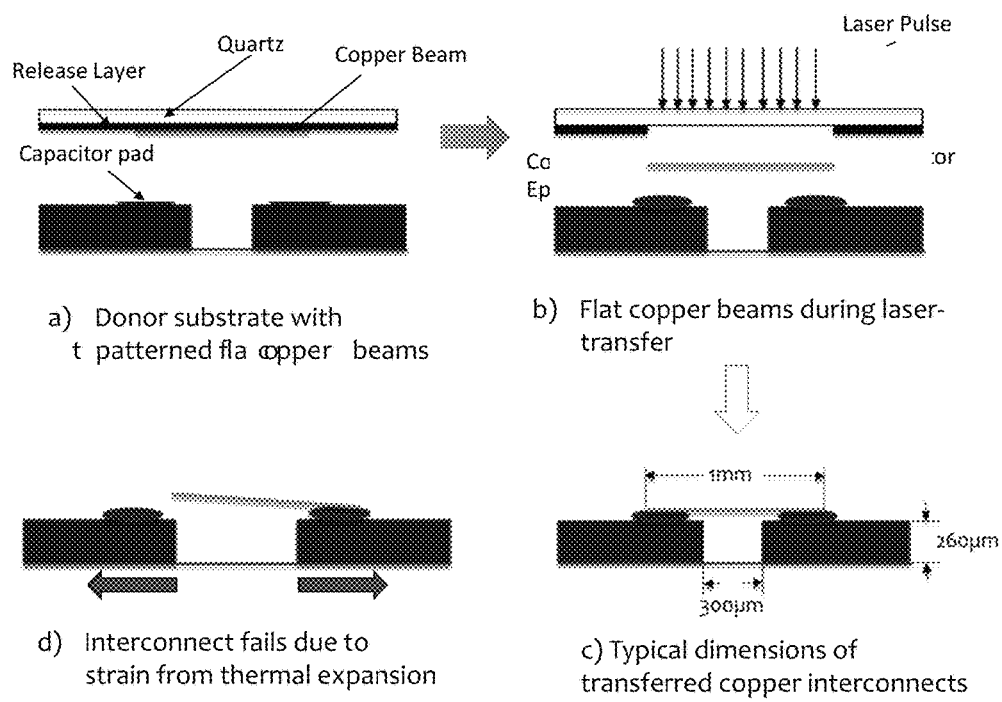
FIG. 2 is a schematic diagram illustrating the process required for the laser transfer of flat interconnects. The limitations of this configuration when subjected to strain are shown in (d). a) shows the donor substrate with patterned flat copper beams. b) shows flat copper beams during laser-transfer. c) shows typical dimensions of transferred copper interconnects. d) shows interconnect fails due to strain from thermal expansion.
Figure 3:
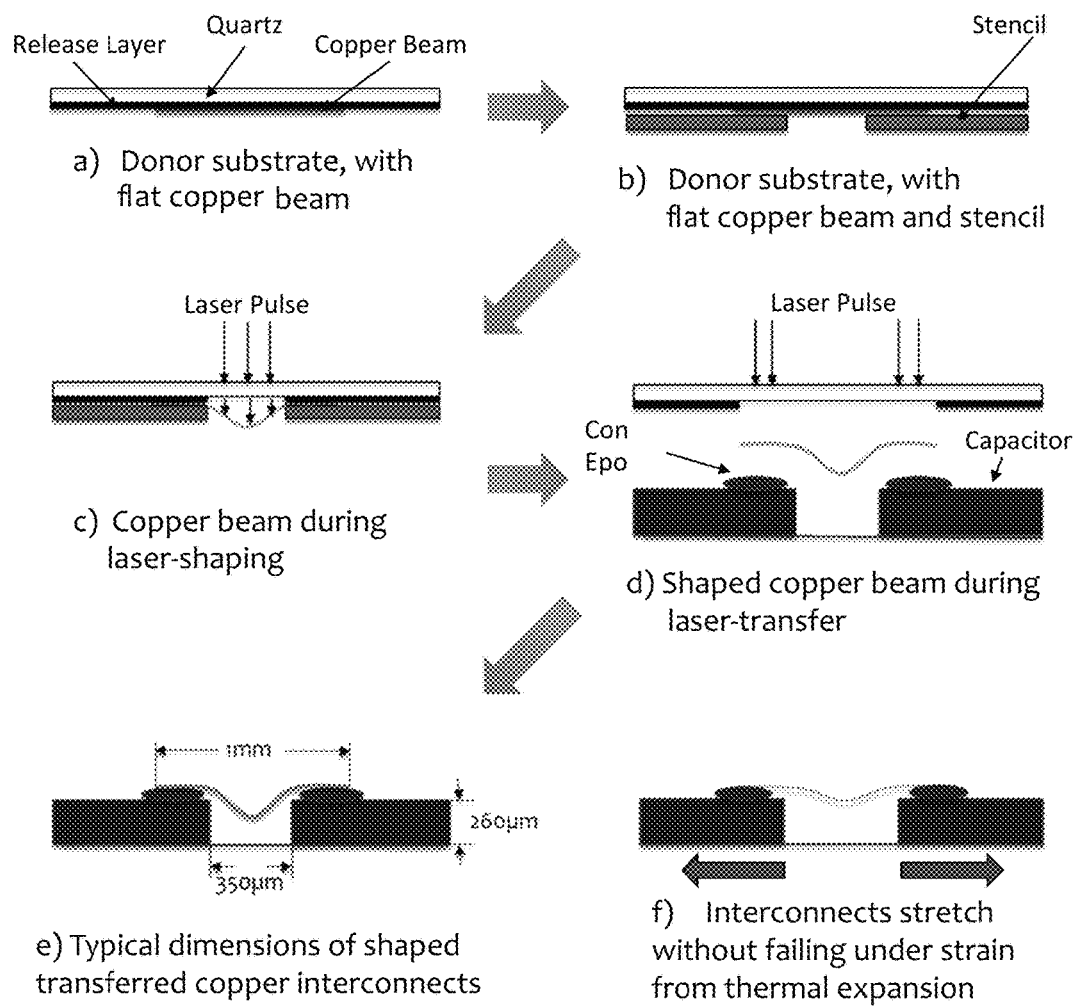
FIG. 3 is a schematic illustrating the process required for the laser forming/shaping and subsequent laser transfer to form electrically conductive and mechanically compliant interconnects. a) shows the donor substrate with flat copper beam. b) shows the donor substrate with flat copper beam and stencil. c) shows copper beam during laser-shaping. d) shows shaped copper beam during laser-transfer. e) shows typical dimensions of shaped transferred copper interconnects. f) shows interconnects stretch without failing under strain from thermal expansion.

A schematic of the process is shown in FIG. 2 for the fabrication of flat interconnects and in FIG. 3 for the fabrication of shaped interconnects. The elements involved in the method of this invention comprise of a laser system, beam preparation and laser transfer of beams to form interconnects. Those elements are described in the following sections with example embodiments.

EXAMPLE 1

Laser System

A 10 watt, 355 nm, solid-state, Q-switched laser with a 30-40 nsec pulse width is used for the patterning, shaping and transfer of the metal interconnects. The laser pulses are delivered to the sample through a 10× UV microscope objective or a galvanometric beam scanner with 100 mm focal length telecentric lens. For laser shaping operations, the full Gaussian beam is used. For most transfer operations, the laser beam is directed through an aperture and imaged onto the sample in order to achieve "top hat" illumination over a well defined spot size. The illuminated spot size is varied by changing the aperture. An acousto-optic modulator is used as a fast shutter to deliver laser pulses on demand and control the delivered energy.

By adjusting the laser pulse energy, the patterning, shaping and transfer steps can be conducted with the same system. Two independent translation stages (X,Y, and Z) allow the movement of the donor substrate with respect to the receive substrate for alignment and focusing purposes.

EXAMPLE 2

Beam Preparation

An adhesion/release layer is formed on a 5 cm dia. quartz disc by dissolving a low temperature wax (Apiezon-W) in toluene and spin coating the solution at room temperature. A copper foil (12.5 microns thick) is laid over the wax layer and bonded using a heated press at approximately 80° C. Conventional photoresist is applied by spin coating and laser exposed along the desired interconnect pattern.

After developing the photoresist, a copper etching solution is used to remove the excess copper. The remaining photoresist and wax are removed using solvents (acetone and toluene). This donor substrate, combined with the release layer and the patterned copper is referred to as the ribbon.

Figure 4:
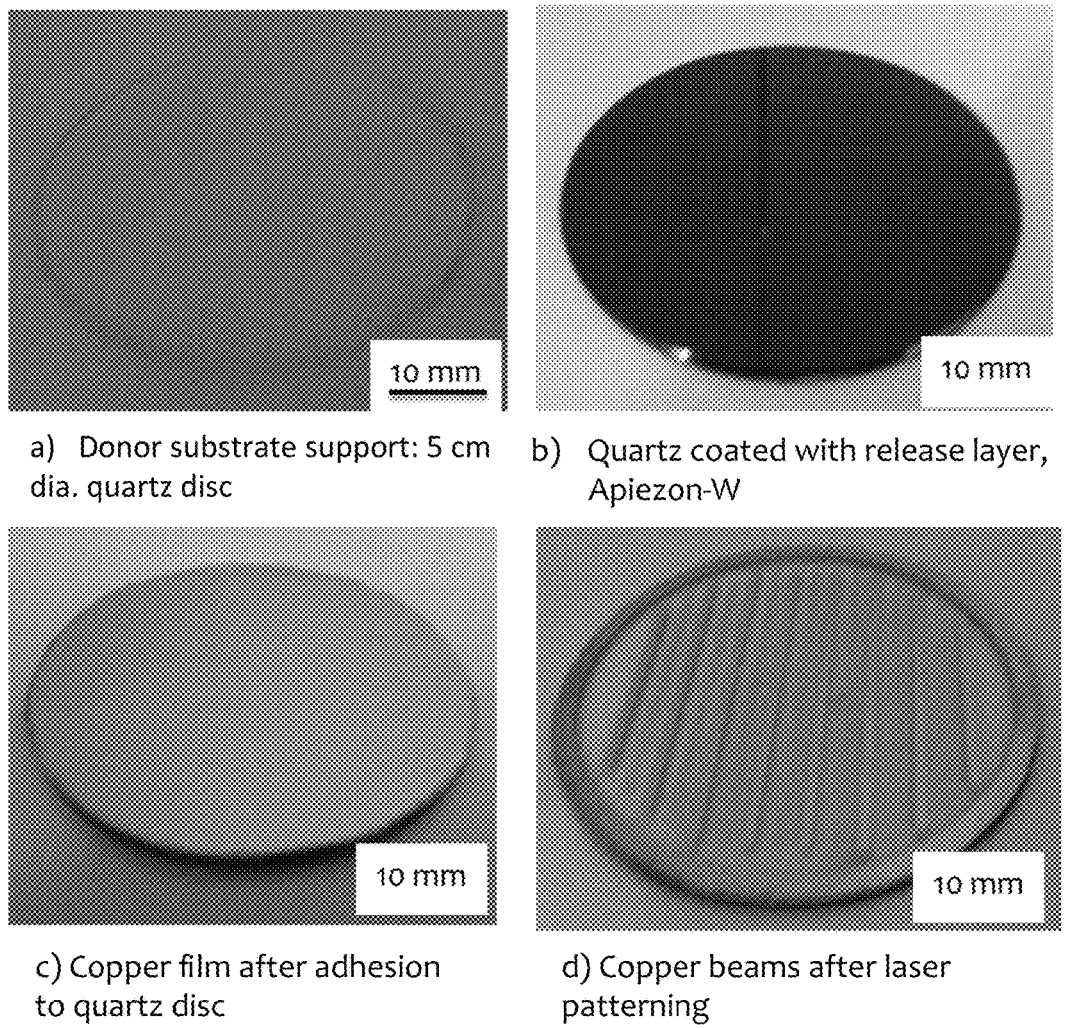
FIG. 4 illustrates the steps for the preparation of the donor substrate comprising: (a) Quartz disc (5 cm dia), (b) coated with a wax release layer, (c) onto which a 12.5 μm thick copper foil is attached and then (d) laser patterned into an array of beams.
Figure 5:
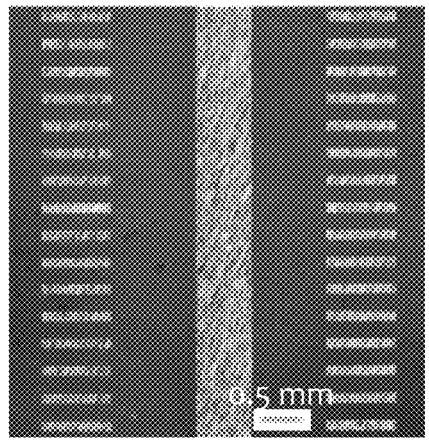
FIG. 5 illustrates a patterned donor substrate showing array of copper beams (a) before and (b) after laser patterning. Higher magnification images of the laser-shaped beams are shown in (c) and (d).
Figure 5:
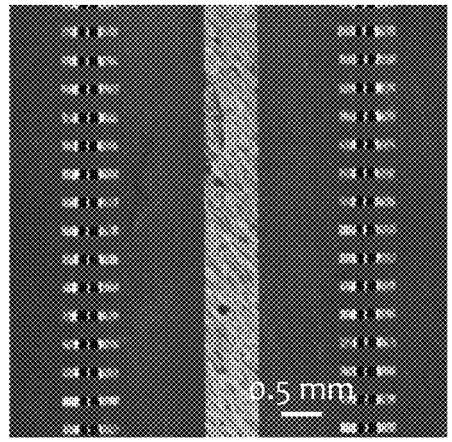
Figure 5:
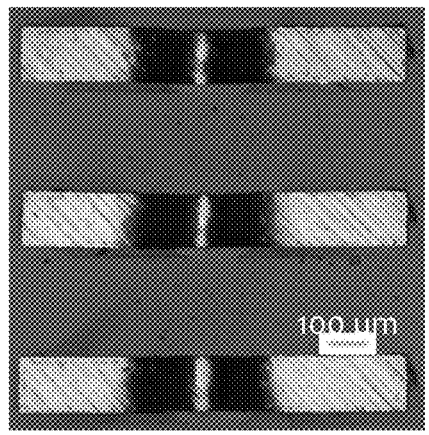
Figure 5:
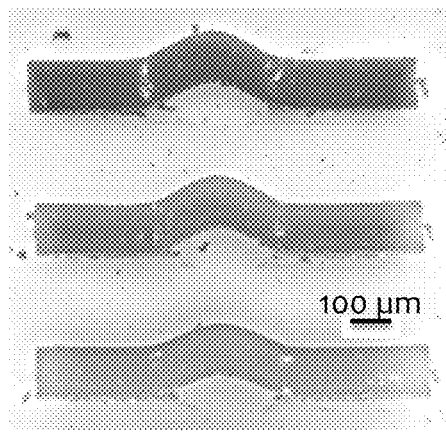

The patterned copper interconnects (referred to as "copper beams") can be transferred directly or laser-bent and subsequently transferred onto a receiving substrate. Bending of the copper beams is achieved by placing a thin metal stencil (400 micron steel) over the ribbon and firing the laser through the glass slide, into the open regions of the stencil. The laser pulse pushes the copper beam away from the ribbon by as much as several hundred microns. In the regions covered by the stencil, the copper beam is confined to the surface of the ribbon. The copper beam is thereby plastically deformed into a shape defined by the stencil and the laser pulse. The measured lase fluence during the bending of the copper beams is around 1.1 J/cm$^2$ for 12.5 μm thick beams. The laser initiated bending of the copper beams is shown schematically in FIG. 3. FIG. 4 shows photographs illustrating the steps in the preparation of the donor substrate and the resulting array of copper beams after laser patterning. Images showing the beams on the donor substrate before and after laser-shaping can be seen in FIG. 5.

EXAMPLE 3

Laser Transfer of Beams

In order to make a robust mechanical and electrical connection to the underlying device a conductive epoxy is used to attach the copper beam to the device. Initial results were achieved by manually placing small quantities of the conductive epoxy H20E on the device pads with a hypodermic needle. H20E is a two-part silver-filed epoxy with relatively long curing time (~2.5 days). Subsequent results used a LIFT process to laser transfer the conductive epoxy in the form of voxels ~10 μm thick onto the device or onto the copper beam. The ribbon was positioned approximately 10-30 μm above the receiving device. The laser was then fired with an appropriate energy and spot size so as to release the copper in a controlled fashion.

In the case of the laser transfer of flat interconnects, shown in FIG. 2, the process flow is described as follows (see FIG. 2 for a schematic of each step):
a. Fabrication of array of isolated copper foils with the desired dimensions by laser patterning.
b. Laser decomposition of polymer backing layer resulting in the release and transfer of one or more copper foils.
c. Landing of the foil(s) precisely over the contact pads on the devices and curing of the conductive paste for mechanical attachment and electrical conduction.

The laser transferred flat interconnects work relatively well except when the circuit is mechanically strained, for example due to expansion or contraction during heating or cooling, as shown schematically in FIG. 2(d).

This problem is resolved by using laser-shaped beams, as shown in FIG. 3. These more compliant interconnects survive mechanical strains as shown in FIG. 3(f).

Figure 6:
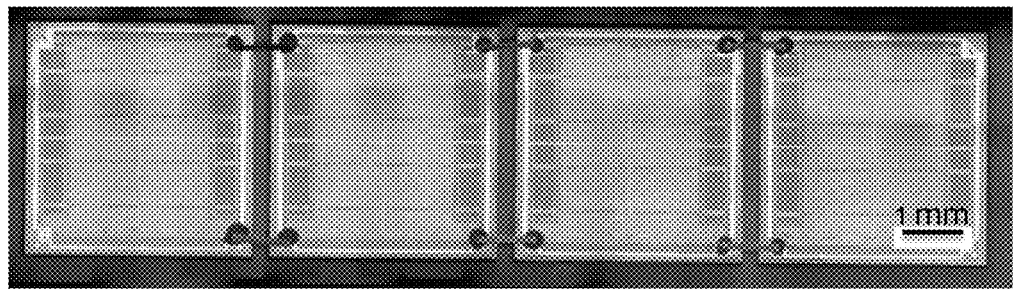
FIG. 6 illustrates photographs showing an electrically functional circuit comprising of four silicon capacitors connected in parallel using a series of laser transferred flat beams as interconnects.
Figure 6:
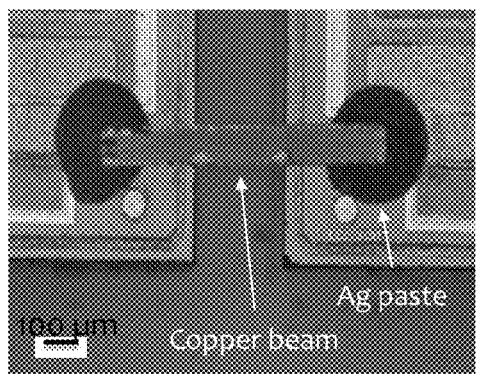
Figure 6:
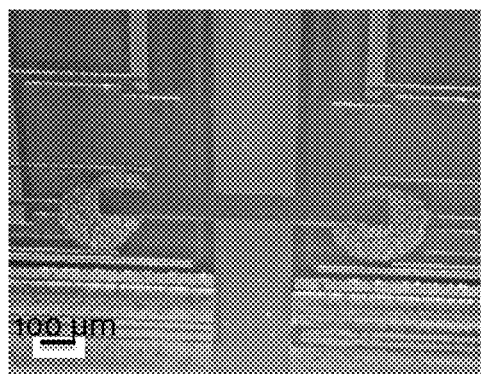
Figure 7:
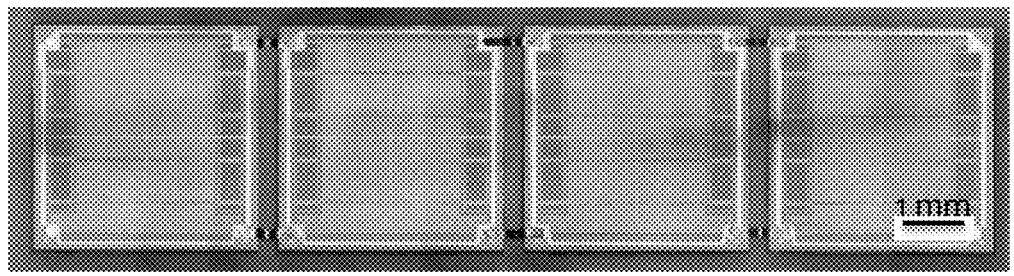
FIG. 7 illustrates photographs showing an electrically functional circuit comprising of four silicon capacitors connected in parallel using a series of laser-shaped and then laser transferred beams as interconnects.
Figure 7:
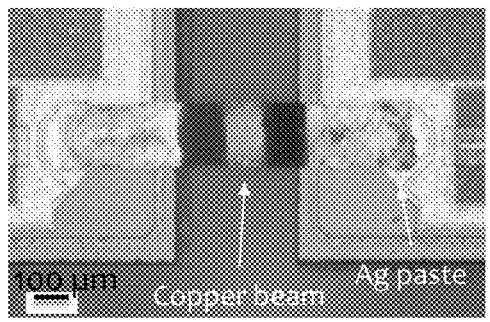
Figure 7:
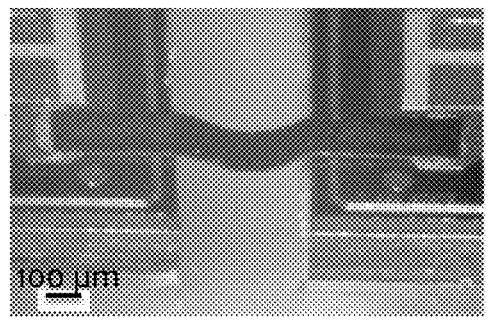
Figure 7:
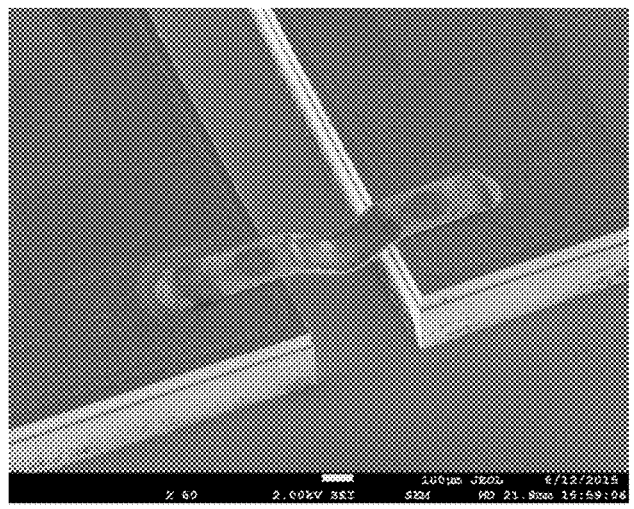

Examples of interconnected devices, in this case individual silicon capacitors mounted on a flat substrate are shown with flat interconnects (FIG. 6) and with laser-shaped interconnects (FIG. 7). In both cases the circuits are electrically functional, i.e. the capacitors connected in parallel for these examples exhibited the expected value for their total capacitance. The measured capacitance of the individual devices was 3.27 µF, and the calculated capacitance of four of them connected in parallel was expected to be 13.08 µF.

Measurements of the laser-connected capacitors indicated a total capacity of 13.05 µF, in excellent agreement with the calculated value. The measured resistance of the copper beams attached to the pads of the silicon capacitors measured to be lower than that of the pads themselves. A four-point resistance measurement between the signal pads and the ground pads returned values of 3.8 and 5.1Ω, respectively.

The overarching challenge is to move away from traditional printed circuit fabrication techniques, which limit the ability to produce conformal, flexible and hybrid designs.

One of the most difficult obstacles toward this goal is to replace the way the interconnects on a circuit are currently generated using soldering of packaged components (bulky and of limited use in a conformal and/or flexible design) and wire-bonding of unpackaged devices (incompatible with the low profile requirements of most conformal and hybrid designs).

The solution to these problems calls for the development of processes and techniques that allow the printing of low profile, yet robust interconnects between discrete components at low temperatures. The low profile requirement eliminates the possibility of using wire-bonding since attachment of the wire to the pads requires that it extends high above the device surface to accommodate strains during the bonding process.

To date the use of printable inks or pastes to form interconnects has only had limited success due to the poor electrical performance of these printed filaments and their fragile nature. Furthermore, to achieve better electrical properties most inks require a curing post-treatment at temperatures above 150° C., rendering them incompatible with low temperature plastic substrates.

The invention described herein, laser-shaped and laser-transferred interconnects, address all the challenges above mentioned by providing a method for the fabrication of arbitrary size and shape beams made from bulk metal and directly placed across the contacts of discrete devices to provide electrical connections that can withstand typical strains and deformations encountered during the operation of electronic circuits.

Furthermore, the resulting laser-shaped and laser-transferred interconnects are fully compatible with the design requirements of next generation conformal, flexible and hybrid circuit designs.

This invention provides a method that can be scaled to achieve high throughput rates for the fabrication and placement of shaped interconnects with customizable lengths and shapes, making it compatible with the fabrication of both circuit designs for mission specific applications requiring low production quantities as well as commercial high volume products. This invention allows for a smaller and more robust device. The approach described herein is unique and offers capabilities that cannot be realized with current processes or technologies.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. An electronic device made from the method of providing a donor ribbon, wherein the donor ribbon comprises an array of metal structures and a release layer on a donor substrate, providing a stencil to the metal structures on the donor substrate, applying a laser pulse through the donor substrate to the metal structures, laser bending the shaped metallic interconnect; and transferring the shaped metallic interconnect onto a receiving substrate or device.

2. The electronic device of claim 1 wherein the method further comprises the steps of delivering laser pulses to the metallic interconnects on the donor substrate; and utilizing two independent translation stages to allow the movement of the donor substrate with respect to the receive substrate for alignment and focusing.

3. The electronic device of claim 1 wherein the laser fluence during bending of the shaped metallic interconnects is 1.1 J/cm² for 12.5 µm thick interconnects and wherein the laser bending of the shaped metallic interconnect comprises the steps of placing a stencil over the metallic interconnects and firing the laser through the donor substrate into open regions of the stencil.

4. The electronic device of claim 1 wherein the step of providing a donor substrate comprising an array of metallic interconnects further includes the steps of dissolving a low temperature wax in toluene and forming a solution; spin coating the solution at room temperature and forming a wax layer; placing a copper foil over the wax layer; bonding the copper foil to the wax layer by heating and pressing at about 80° C.; applying a photoresist to the copper foil; exposing and developing the photoresist; etching the copper foil to create the desired interconnect; and removing the remaining photoresist.

5. An electronic device made from the method of providing a donor ribbon, wherein the donor ribbon comprises an array of metal structures and a release layer on a donor substrate, providing a stencil to the metal structures on the donor substrate, applying a laser pulse through the donor substrate to the metal structures, and directing the metal structures to an electronic device.

6. The electronic device of claim 5 wherein the method further includes the step of applying conductive epoxy to the electronic device or to the metal structure prior to the step of directing the metal structures to an electronic device prior to the step of directing the metal structures to an electronic device.

7. The electronic device of claim 5 wherein the metal structures are copper beams.

8. The electronic device of claim 5 wherein the conductive epoxy comprises H20E.

9. An electronic device made from the method of providing a donor substrate comprising an array of metallic interconnects, using a laser system to prepare the metallic interconnects, forming shaped metallic interconnects, laser bending the shaped metallic interconnects; and transferring the shaped metallic interconnects onto a receiving substrate or device.

* * * * *